United States Patent [19]  [11]  4,432,006
Takei  [45]  Feb. 14, 1984

[54] SEMICONDUCTOR MEMORY DEVICE
[75] Inventor: Akira Takei, Yokohama, Japan
[73] Assignee: Fujitsu Limited, Kawasaki
[21] Appl. No.: 182,671
[22] Filed: Aug. 29, 1980
[30] Foreign Application Priority Data
Aug. 30, 1979 [JP] Japan ................................. 54-109640
[51] Int. Cl.³ ..................... H01L 27/04; G11C 11/40
[52] U.S. Cl. ........................................ 357/23; 357/59
[58] Field of Search ............... 357/23 S, 23 C, 23 TF, 357/23 R, 41, 51, 59

[56] References Cited
U.S. PATENT DOCUMENTS
3,387,286  6/1968  Dennard ........................... 357/23 C
3,600,651  8/1971  Duncan ........................... 357/23 TF
4,041,518  8/1977  Shimizu et al. ................. 357/23 TF
4,156,939  5/1979  Takemae et al. ................. 357/23 C
4,251,828  2/1981  Sakurai ........................... 357/23 TF
4,353,085 10/1982  Sakurai .................................. 357/41

FOREIGN PATENT DOCUMENTS
55-22881  2/1980  Japan ................................ 357/23 C
55-61060  5/1980  Japan ................................ 357/23 C OTHER PUBLICATIONS
May et al., IEEE Trans. ED, vol. ED 26, no. 1, Jan. 1979, pp. 2-8.
Barson et al., IBM Tech. Discl. Bulletin, vol. 16, No. 6, Nov. 1973, p. 1698.

Primary Examiner—William D. Larkins
Attorney, Agent, or Firm—Staas & Halsey

[57] ABSTRACT

In a semiconductor memory device of the present, due to a heavily doped region formed on the semiconductor substrate, the depletion layer does not spread deeply toward the interior of the semiconductor substrate. In addition, a capacitor is formed by the heavily doped region, an insulating film formed on this region and a semiconductor layer formed on this insulating film. As a result, variation of capacitance of the capacitor due to α-ray particles is low. Furthermore, information is stored in the semiconductor layer which is formed above the semiconductor substrate so that the occurrence of a soft error is minimized.

8 Claims, 6 Drawing Figures

SEMICONDUCTOR MEMORY DEVICE

BACKGROUND OF THE INVENTION

The present invention relates to a semiconductor memory device, more particularly a semiconductor memory device, in which the occurrence of a soft error is minimized, and a process for producing the semiconductor memory device.

In semiconductor memory devices, the integration degree of the memory circuit has been enhanced continually over the years, and a dynamic memory cell having a capacity of 64K bits and one transistor per memory cell is mainly employed for a memory circuit at the present time. Since the provision of a memory cell having a minute surface ,area is presently desired, a dynamic memory cell having a surface area smaller than that of the 64K bit dynamic cell will be produced in the future.

Dynamic memory cells must be refreshed, so as to prevent the destruction of the information which is stored in the memory cell as the existence or non-existence of electric charges in the form of minority carriers. The destruction of the information occurs due to generation of thermal carriers in the depletion regions which spread out in the semiconductor substrate of the memory cell. In operating the memory cells, a positive voltage is applied to a semiconductor substrate via a MOS electrode of the memory cells, when the semiconductor substrate has a P type conductivity. As a result of the application of the positive voltage, a depletion layer spreads in the semiconductor substrate according to the number of minority carriers stored in the memory cell. If electron-hole pairs are generated in the semiconductor substrate of the memory cell, during the non-existence state of the minority carriers, namely the storing state of the information "0", holes are swept out from the depletion region, but electrons are diffused toward and stored at the interface between the substrate and an $SiO_2$ layer under the MOS electrode. As a result, the information which is stored in the substrate surface is destroyed.

Recently, attention has been directed to another reason for the generation of electron-hole pairs, which is the generation of electron-hole pairs caused by absorption of α-particles by the memory cells. Some of the electrons of the so generated electron-hole pairs stay in the depletion layer and others of the electrons, which are collected in the depletion layer, destroy the information. Such destruction is referred to as a soft error. One source of α-rays is cosmic rays and another source is emissions from the radioactive materials contained in a package material. As long as the semiconductor device mounted in the package is used in ambient air, the problem of soft error inevitably occurs.

SUMMARY OF THE INVENTION

It is an object of the present invention to provide a semiconductor memory device, in which the occurrence of soft errors is minimized.

It is another object of the present invention to provide a soft error reduction technique which does not rely on selection of the package material.

It is a further object of the present invention to provide a simple process for producing a semiconductor memory device in which the occurrence of soft errors is minimized.

In accordance with the objects of the present invention there is provided a semiconductor memory device comprising:

a semiconductor substrate having a first conductivity type;

a heavily doped region having the first conductivity type and formed in a first surface region of the semiconductor substrate;

a first insulating film formed on the heavily doped region;

a semiconductor layer of a second conductivity type opposite to the first conductivity type formed after the first insulating film;

a capacitor comprising (a) a part of the first insulating film, (b) the heavily doped region and (c) a gate made of a first part of the semiconductor layer which is disposed on the first insulating film;

an information storing region established in the first part of the semiconductor layer; and a transistor having source, channel and drain regions, and comprising a second part of the semiconductor layer, the source region being short-circuited with the gate of the capacitor, and the second part mentioned above including the semiconductor layer formed on a second surface region of the semiconductor substrate.

In the semiconductor memory device of the present invention, the semiconductor substrate has a $P^-(N^-)$ conductivity, i.e. a first conductivity type. The P(N) type impurities are implanted, preferably by an ion implantation, on a surface region, i.e. a first surface region, of the semiconductor substrate at a concentration of, preferably, from $10^{13}$ to $10^{14}/cm^3$. The implanted depth of the impurities is preferably not more than 2000 Å from the substrate surface. Due to the heavily doped region formed by, for example, ion implantation, the depletion layer does not spread deeply toward the interior of the semiconductor substrate. As a result, the possibility of generation of electron-hole pairs in the depletion layer due to α-ray particles, which can usually penetrate silicon to a depth of 25 microns, is reduced as compared with the conventional semiconductor memory devices, in which the information is stored at the interface between the insulating film and the semiconductor substrate.

In the semiconductor memory device of the present invention, the capacitor is formed by the heavily doped region of $P^+(N^+)$ conductivity, an insulating film formed on this region and a semiconductor layer formed on this insulating film. As a result, variation of capacitance of the capacitor due to the α-ray particles is much lower than in the conventional semiconductor memory devices. This is because the possibility of generation of electron-hole pairs in the insulating material, such as silicon dioxide ($SiO_2$), is considerably lower than that in the silicon.

When the impurity concentration of the heavily doped region is approximately $5 \times 10^{18}/cm^3$, the variation mentioned above is approximately 6% or lower, which is not large enough to cause a soft error. The $P^-(N^-)$ type semiconductor substrate in contact with the capacitor acts as one of the electrodes of the capacitor.

In the semiconductor device of the present invention, information is stored not at the interface between the substrate and the insulating film, but in the semiconductor layer which is formed above the semiconductor substrate. Therefore, the storage of information is not influenced by the interface properties and, as a result, the surface state density between the insulating film and the substrate do not greatly influence the characteristics of the memory device as they do in the conventional semiconductor memory devices. The breakdown voltage of the insulating film is a major point to be considered when selecting the material of the insulating film. Not only the conventional silicon dioxide, but also, silicon nitride and tantalum oxide can be used as the insulating film.

The methods of writing, reading and refreshing the information with the present invention are the same as those of the conventional one transistor-one capacitor memory device.

A process for producing a semiconductor device according to the present invention comprises the steps of:

forming a first insulating film on a first surface region of a single crystalline semiconductor substrate, where an information-storing region is to be formed;

ion-implanting the impurities having the first conductivity type through the first insulating film into the single crystalline semiconductor substrate;

depositing a semiconductor layer over the semiconductor substrate at least on the first insulating film and on a second surface region of the single crystalline semiconductor substrate, where a transistor electrically connected to the information-storing region is to be formed, the semiconductor layer including a single crystalline region and a polycrystalline region; and forming a gate insulating film of the transistor on the single crystalline region of the semiconductor layer.

In the process according to the present invention, the semiconductor memory device, wherein the occurrence of soft errors is minimized, can be simply produced, as explained hereinbelow in detail with reference to the drawings.

BRIEF DESCRIPTION OF THE DRAWINGS

The embodiments of the present invention are explained hereinafter with reference to the drawings, wherein.

DETAILED DESCRIPTION OF THE PREFERRED EMBODIMENTS

Figure 1:
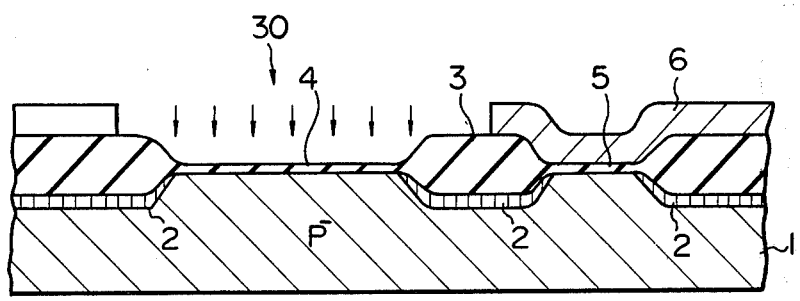
FIGS. 1 through 6 illustrate the steps of producing a semiconductor memory device of the present invention.

Referring to FIG. 1, a first insulating film made of silicon dioxide and hereinafter referred to as a first oxide film 4 is formed on a first surface region of a P− type silicon substrate 1 having an impurity concentration of up to $10^{15}/cm^3$. The P− type silicon substrate 1 is provided with a second insulating film made of silicon dioxide, thicker than the first oxide film and hereinafter referred to as a second oxide film 3. The second oxide film 3 is formed on the semiconductor substrate surface between the first surface region, where the first oxide film 4 is formed, and a second surface region of the silicon substrate 1, on which a single crystalline part 9b (FIG. 5) will be formed. The second oxide film (SiO$_2$ film) 3 having a thickness of, for example, 8000 Å, is formed by a known selective oxidation on the silicon substrate 1 between the first and second surface regions, and reliably isolates the P+ type heavily doped region 7 (FIG. 6) from the N+ type source region 41. In the semiconductor device of the present invention, the P+(N+) type heavily doped region is formed near the N(P) type source region, and the breakdown voltage between these regions is enhanced by the thick second oxide film, so that a refreshing failure is not liable to occur.

A channel stopper 2 is formed beneath the second oxide film 3 by a known selective oxidation process. After the formation of the channel stopper 2 and the second oxide film 3, the first oxide film 4 and a thin oxide film 5 made of silicon dioxide are simultaneously formed by a known thermal oxidation process, so that these films 4 and 5 have a thickness of up to approximately 400 Å. Subsequently, a photo resist 6 is disposed so as to expose the information-storing region 30 and, then, the boron ions are implanted, as indicated by the arrows, using the photo resist 6 as a mask at an energy of up to 40 keV and a dosing amount of up to $5 \times 10^{13}/cm^2$.

Figure 2:
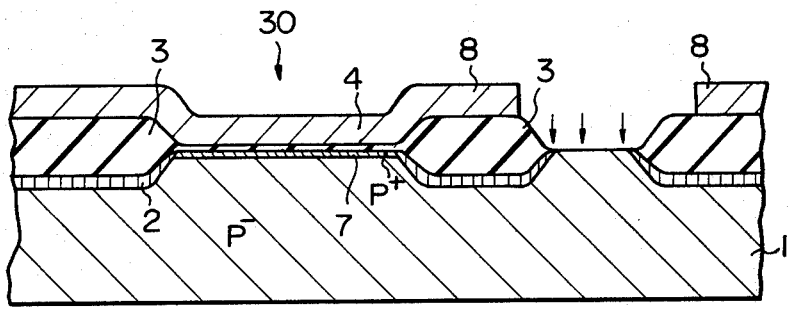

Referring to FIG. 2, the P+ type heavily doped region formed as a result of the ion implantation is indicated by 7. In the production step of FIG. 2, the second surface region of the silicon substrate is exposed and subjected to an ion implantation, as illustrated by the arrows, using the photo resist 8 as a mask. The P+ type region (not shown in FIG. 2) so formed by the ion implantation is for the purpose of the threshold voltage control. In the ion implantation, the boron ions may be implanted at a dosing amount of up to $4 \times 10^{11}/cm^2$.

Figure 3:
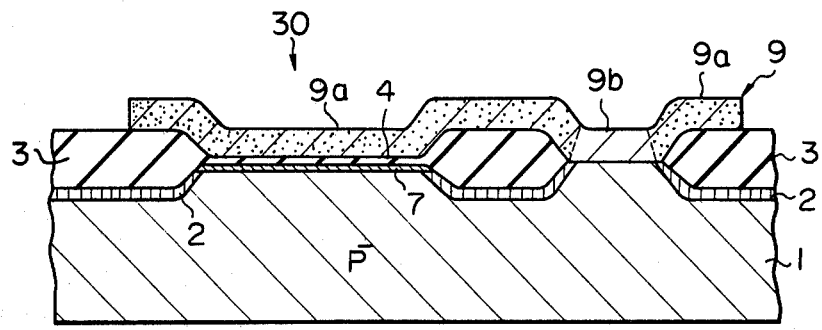

Referring to FIG. 3, the photo resist 8 is removed and, then, a silicon layer 9 is deposited to a thickness of up to approximately 0.5 microns. The silicon layer 9 is deposited over the entire surface of the silicon substrate 1 and, then, is selectively removed so that it remains on the individual memory cells.

The deposition of the silicon layer 9 may be performed by a vapor phase growth, thereby epitaxially growing the single crystalline region 9b on the second surface region of the silicon substrate 1, and chemically vapor-depositing (CVD) the polycrystalline region 9a on the first and second oxide films 4 and 3, respectively. Since the silicon dioxide of the films 3 and 4 is amorphous, and further, since the silicon substrate 1 is single crystalline, the silicon layer 9 becomes single crystalline (9b) on the substrate and polycrystalline (9a) on the films 3 and 4. The polycrystalline region 9a can be used for the information storing region and a part of the capacitor, including the capacitor electrode, as well as the source and drain regions of an MOS transistor. The single crystalline region 9a can be used for the channel region of the MOS transistor. These various regions and parts of the memory device can advantageously be produced by a single step of the vapor phase growth process.

Although not illustrated in the drawings, the silicon layer including the single crystalline and polycrystallines can be produced by CVD followed by a laser-beam annealing to convert polycrystal to single crystalline.

Figure 4:
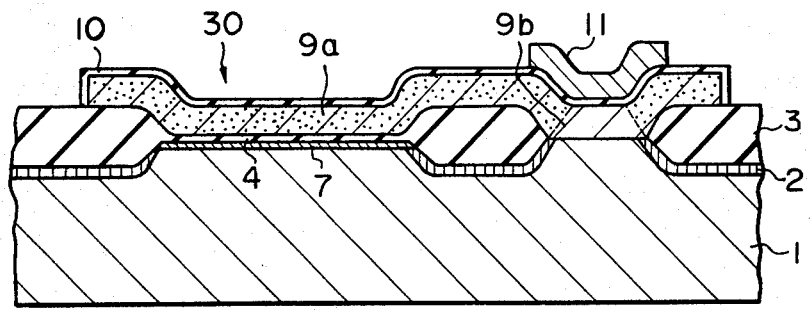

Referring to FIG. 4, the entire surface of the silicon layer 9 is thermally oxidized, so that an oxide film 10 made of silicon dioxide (SiO$_2$) is formed. The thickness of the oxide film 10 is up to approximately 500 Å. A main purpose of the formation of the oxide film 10 is to prepare a gate oxide film of an MOS transistor. However, in the step illustrated in FIG. 4, the silicon layer 9 is entirely oxidized and, thus, a pattern formation of the gate of the MOS transistor on the silicon layer 9 is omitted. After the thermal oxidation of the silicon layer 9, a polycrystalline silicon layer 11, which constitutes a gate electrode of the MOS transistor, is formed at a predetermined position.

Figure 5:
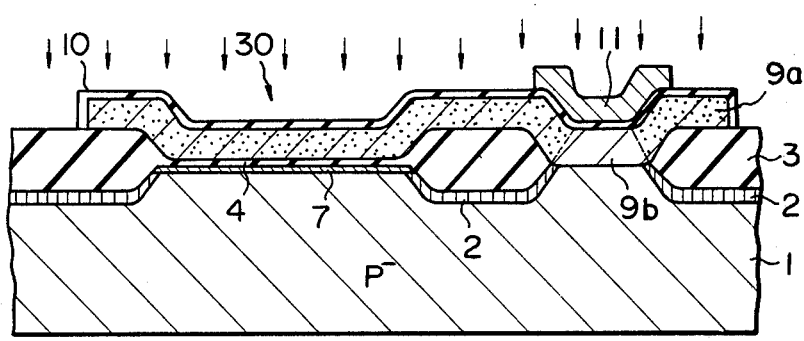

Referring to FIG. 5, the impurities having a second conductivity type are doped into the silicon layer 9, in such a manner that the impurities are selectively introduced into the polycrystalline part 9a of the silicon layer 9. N type impurities, such as arsenic, are doped, preferably by ion-implantation (illustrated by arrows), into the polycrystalline silicon layer 11, as well as into the silicon layer 9, through the oxide film 10 which is not covered by the polycrystalliine silicon layer 11.

When arsenic ions are implanted, the energy and dosing amount of the arsenic ions may be up to 100 keV and up to $5 \times 10^{15}/cm^2$, respectively. After the arsenic ions are implanted, annealing is carried out at, preferably 1050° C. Since the diffusion coefficient of arsenic in single crystalline silicon is approximately 1/1000 times that in a polycrystalline silicon, the arsenic ions rapidly advance or diffuse through the polycrystalline silicon until the arsenic ions arrive at the boundary between the polycrystalline and single crystalline regions 9a and 9b, respectively, and then, the diffusion rate of the arsenic ions is suddenly reduced. Accordingly, the arsenic impurities are doped in the entire polycrystalline region 9a and a narrow part of the single crystalline region 9b adjacent to the polycrystalline region 9a. The N+ type source region 41 and the N+ type drain region 42 of the MOS transistor 20, as well as the N+ type semiconductor of the memory cell region 30, are thusly formed in self alignment.

The arsenic ions are introduced slightly into the single crystalline region 9b which is integral with the polycrystalline region 9a of the silicon layer, with the consequence that a PN junction 47 is formed in the single crystalline region 9b. Current leakage through the PN junction 47 does not occur appreciably because such a junction is formed in the single crystalline region 9b.

Figure 6:
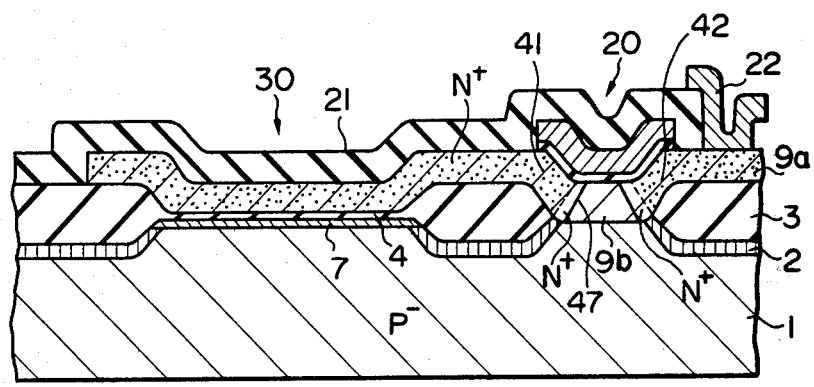

A single memory cell of the semiconductor memory device according to the present invention is illustrated in FIG. 6. 21 indicates the phosphosilicate glass (PSG) film for passivation and 22 indicates a bit line. The source region 41 of the MOS transistor is short-circuited with the gate of the capacitor (the polycrystalline silicon layer 9a formed on the first insulating film). Although the drain region 42 comprising polycrystalline silicon is formed on the second insulating film 3 (FIG. 6), the drain region 42 may be single crystalline and formed on the silicon substrate 1 which may have a mesa type surface configuration as indicated by reference numeral 2.

From the foregoing description it will be understood that soft errors of dynamic memory cells of the present invention are reduced as compared to the conventional dynamic memory cells, in which the information is stored at the interface between the semiconductor substrate and the insulating film.

I claim:

1. A semiconductor memory device comprising:
   a semiconductor substrate having a first conductivity type and first and second surface regions that are separated from each other;
   a heavily doped region having said first conductivity type formed in said first surface region of said semiconductor substrate;
   a first insulating film formed on said heavily doped region over said first surface region of said semiconductor substrate and leaving exposed said second surface region of said semiconductor substrate;
   a semiconductor layer, including a first part formed on said first insulating film over said first surface region, and a second part formed on said semiconductor substrate in said second surface region, said second part including a single-crystalline region where said second part of said semiconductor layer contacts said semiconductor substrate in said second surface region;
   a capacitor comprising (a) at least a part of said first insulating film over said first surface region of said semiconductor substrate, (b) at least a part of said heavily doped region in said first surface region of said semiconductor substrate, and (c) said first part of said semiconductor layer which is disposed on said first insulating film over said first surface region of said substrate, said first part of said semiconductor layer over said first surface region comprising an information storage region; and
   said second part of said semiconductor layer comprising the source, channel and drain regions of a transistor, said source region being short-circuited with said first part of the semiconductor layer comprised in said capacitor.

2. A semiconductor memory device according to claim 1, wherein a second insulating film thicker than said first insulating film is formed on the semiconductor substrate surface between said first and second surface regions.

3. A semiconductor memory device according to claim 2, wherein a channel stopper having said first conductivity type is formed beneath said second insulating film.

4. A semiconductor memory device according to claim 2, wherein said first part of the semiconductor layer is polycrystalline, said channel region is formed in the single crystalline region of said second part of the semiconductor layer contacting said semiconductor substrate, and said channel region has said first conductivity type.

5. A semiconductor memory device according to claim 4, wherein said second part of the semiconductor layer includes two polycrystalline regions formed on said second insulating film for respectively contacting said source and drain regions.

6. A semiconductor memory device according to claim 5, wherein the PN junctions between said channel region and each of said source and drain regions are located in said single crystalline region of said second part of the semiconductor layer.

7. The device of claim 1, 2, 3, 4, 5 or 6, said heavily doped region having an impurity concentration of at least $5 \times 10^{18}/cm^3$.

8. The device of claim 7, said heavily doped region being not deeper than 2000 Å.

* * * * *

UNITED STATES PATENT AND TRADEMARK OFFICE
CERTIFICATE OF CORRECTION

PATENT NO. : 4,432,006

DATED : 14 February 1984

INVENTOR(S) : Takei

It is certified that error appears in the above-identified patent and that said Letters Patent is hereby corrected as shown below:

Column 4, line 53, "lines" should be --line portions--;

line 55, "line" should be --line semiconductor--.

Column 6, line 13, "where" should be --wherein--;

line 32, "thickner" should be --thicker--.

Signed and Sealed this

Fourth Day of September 1984

[SEAL]

Attest:

Attesting Officer

GERALD J. MOSSINGHOFF

Commissioner of Patents and Trademarks